US008885122B2

(12) United States Patent
Yoon

(10) Patent No.: US 8,885,122 B2
(45) Date of Patent: Nov. 11, 2014

(54) LIGHT EMITTING DIODE, METHOD OF FABRICATING THE SAME, AND LIQUID CRYSTAL DISPLAY INCLUDING THE SAME

(75) Inventor: Min-Sung Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 176 days.

(21) Appl. No.: 13/181,077

(22) Filed: Jul. 12, 2011

(65) Prior Publication Data

US 2012/0013827 A1    Jan. 19, 2012

(30) Foreign Application Priority Data

Jul. 13, 2010  (KR) ........................ 10-2010-0067397

(51) Int. Cl.
```
G02F 1/1335      (2006.01)
H01L 33/46       (2010.01)
H01L 33/44       (2010.01)
H01L 33/10       (2010.01)
H01L 33/12       (2010.01)
```
(52) U.S. Cl.
CPC ............... H01L 33/46 (2013.01); H01L 33/44 (2013.01); G02F 1/133603 (2013.01); G02F 1/13362 (2013.01); H01L 33/10 (2013.01); H01L 33/12 (2013.01)
USPC .............................. 349/96; 349/103; 257/98

(58) Field of Classification Search
None
See application file for complete search history.

(56) References Cited

U.S. PATENT DOCUMENTS

```
4,289,381  A  *   9/1981   Garvin et al. ............... 359/900
6,631,031  B2    10/2003   Lee et al.
2007/0131928 A1 *  6/2007   Kwak et al. ................. 257/40
2008/0290336 A1 * 11/2008   Park et al. ................... 257/13
2010/0127238 A1 *  5/2010   Kim et al. ................... 257/98
```

OTHER PUBLICATIONS

"Metal-mesh achromatic half-wave plate for use at submillimeter wavelengths" by Pisano et al., Applied Optics 20 vol. 47, No. 33, Nov. 2008, pp. 6251 to 6256.*
"Extraction enhancement in organic light emitting devices by using metallic nanowire arrays"; Hsu, et al. Applied Physics Letters 92, 013303 (2008).

* cited by examiner

*Primary Examiner* — Richard Kim
*Assistant Examiner* — Ryan Crockett
(74) *Attorney, Agent, or Firm* — McKenna Long & Aldridge LLP

(57) ABSTRACT

A light emitting diode includes a first grid layer on a substrate and made of a metal material; a p-n semiconductor multiple-layered film on the first grid layer; and a second grid layer on the p-n semiconductor multiple-layered film and made of a metal material, wherein the first grid layer includes a base layer, and a plurality of first grid wires that protrudes from the base layer and are along a first direction, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

24 Claims, 8 Drawing Sheets

LIGHT EMITTING DIODE, METHOD OF FABRICATING THE SAME, AND LIQUID CRYSTAL DISPLAY INCLUDING THE SAME

The present invention claims the benefit of Korean Patent Application No. 10-2010-0067397, filed in Korea on Jul. 13, 2010, which is hereby incorporated by reference for all purposes as if fully set forth herein.

BACKGROUND OF THE INVENTION

1. Field of the Invention

The present invention relates to a light emitting diode, and more particularly, to a light emitting diode, method of fabricating the same, and a liquid crystal display including the same.

2. Discussion of the Related Art

Recently, light emitting diodes (LEDs) are widely used display devices because the LEDs have small size, low power consumption, high reliability and the like. A nitride semiconductor is used as a material of the LED.

FIG. 1 is a view illustrating a nitride semiconductor LED according to the related art.

Referring to FIG. 1, the nitride semiconductor LED 37 includes a buffer layer 23, an n (negative) type semiconductor layer 25, an active layer 27, a p (positive) type semiconductor layer 29, a transparent electrode 31, an n type metal electrode 35 and a p type metal electrode 33 that are on a substrate 21.

Since the nitride semiconductor LED 37 uses a sapphire substrate 21 of a insulator, the n type semiconductor layer 25 are partially etched in step shape in order to form the electrodes 33 and 35, and thus the electrodes are arranged in a Top-Top manner.

In other words, the n type metal electrode 35 is formed at a corner of the exposed n type semiconductor layer 25, and the p type metal electrode 33 is formed on the transparent electrode 31.

The nitride semiconductor LED 37 emits light through combination of holes from the p type metal electrode 33 and electrons from the n type metal electrode 35. The LED 37 are widely used for various field such as advertising boards, liquid crystal displays (LCDs) and the like that require light sources.

However, since a light emitted from the LED 37 is a non-polarized light like a natural scattered light, for a display device such as an LCD that needs a specific polarized light, additional materials such as a polarizing plate is required.

However, in this case, the light from the LED 37 is lost by about 40 to 50% passing through the polarizing plate. Accordingly, brightness of the display device is reduced. To prevent the reduction of brightness, increasing luminance of light emitted from the LED 37 might be suggested. This, however, causes increase of power consumption.

SUMMARY OF THE INVENTION

Accordingly, the present invention is directed to a light emitting diode, a method of fabricating the same, and a liquid crystal display including the same which substantially obviates one or more of the problems due to limitations and disadvantages of the related art.

An advantage of the present invention is to provide a light emitting diode, a method of fabricating the same, and a liquid crystal display including the same that can improve loss of light.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, a light emitting diode includes a first grid layer on a substrate and made of a metal material; a p-n semiconductor multiple-layered film on the first grid layer; and a second grid layer on the p-n semiconductor multiple-layered film and made of a metal material, wherein the first grid layer includes a base layer, and a plurality of first grid wires that protrudes from the base layer and are along a first direction, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

In another aspect, a method of fabricating a light emitting diode includes forming a first grid layer on a substrate and made of a metal material; forming a p-n semiconductor multiple-layered film on the first grid layer; and forming a second grid layer on the p-n semiconductor multiple-layered film and made of a metal material, wherein the first grid layer includes a base layer, and a plurality of first grid wires that protrudes from the base layer and are along a first direction, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

In yet another aspect, a liquid crystal display includes a liquid crystal panel; a backlight unit including a light emitting diode and supplying light to the liquid crystal panel; and a polarizing plate between the liquid crystal panel and the backlight unit, wherein the light emitting diode includes a first grid layer on a substrate and made of a metal material, a p-n semiconductor multiple-layered film on the first grid layer, and a second grid layer on the p-n semiconductor multiple-layered film and made of a metal material, wherein the first grid layer includes a base layer, and a plurality of first grid wires that protrudes from the base layer and are along a first direction, wherein the second grid layer includes a plurality of second grid wires along a second direction, wherein the p-n semiconductor multiple-layered film includes an active layer, a n type semiconductor layer between the first grid layer and the active layer, and a p type semiconductor layer between the second grid layer and the active layer, and wherein a polarizing axis of the polarizing plate is perpendicular to the second direction.

In yet another aspect, a light emitting diode includes a first grid layer on a substrate and made of a metal material; a p-n semiconductor multiple-layered film on the first grid layer; and a second grid layer on the p-n semiconductor multiple-layered film and made of a metal material, wherein the first grid layer includes a base layer, a plurality of first grid wires that protrudes from the base layer and are along a first direction, and a plurality of third grid wires that protrudes from the base layer and are along a third direction, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

In yet another aspect, a method of fabricating a light emitting diode includes forming a first grid layer on a substrate and made of a metal material; forming a p-n semiconductor multiple-layered film on the first grid layer; and forming a second grid layer on the p-n semiconductor multiple-layered film and made of a metal material, wherein the first grid layer includes a base layer, a plurality of first grid wires that protrudes from the base layer and are along a first direction, and a plurality of third grid wires that protrudes from the base layer and are along a third direction, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

In yet another aspect, a liquid crystal display includes a liquid crystal panel; a backlight unit including a light emitting diode and supplying light to the liquid crystal panel; and a polarizing plate between the liquid crystal panel and the backlight unit, wherein the light emitting diode includes a first grid layer on a substrate and made of a metal material, a p-n semiconductor multiple-layered film on the first grid layer, and a second grid layer on the p-n semiconductor multiple-layered film and made of a metal material, wherein the first grid layer includes a base layer, a plurality of first grid wires that protrudes from the base layer and are along a first direction, and a plurality of third grid wires that protrudes from the base layer and are along a third direction, wherein the second grid layer includes a plurality of second grid wires along a second direction, wherein the p-n semiconductor multiple-layered film includes an active layer, a n type semiconductor layer between the first grid layer and the active layer, and a p type semiconductor layer between the second grid layer and the active layer, and wherein a polarizing axis of the polarizing plate is perpendicular to the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
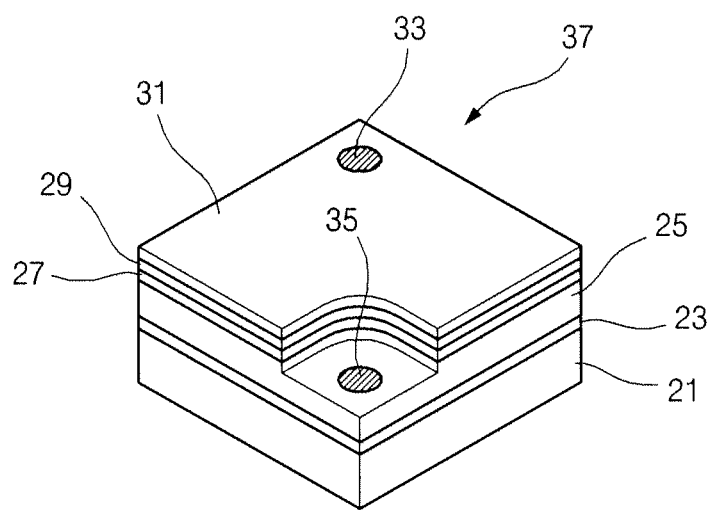
FIG. 1 is a view illustrating a nitride semiconductor LED according to the related art.
Figure 2:
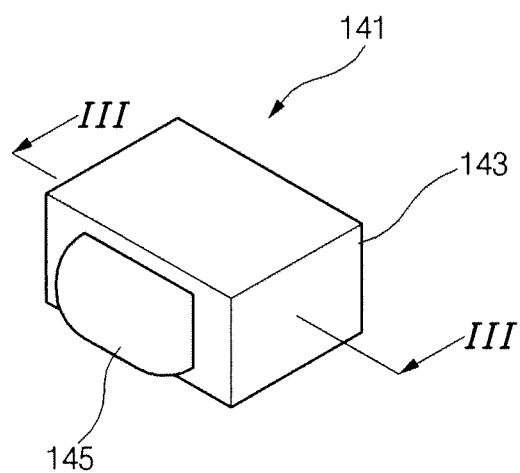
FIG. 2 is a view illustrating an LED element according to a first embodiment of the present invention.
Figure 3:
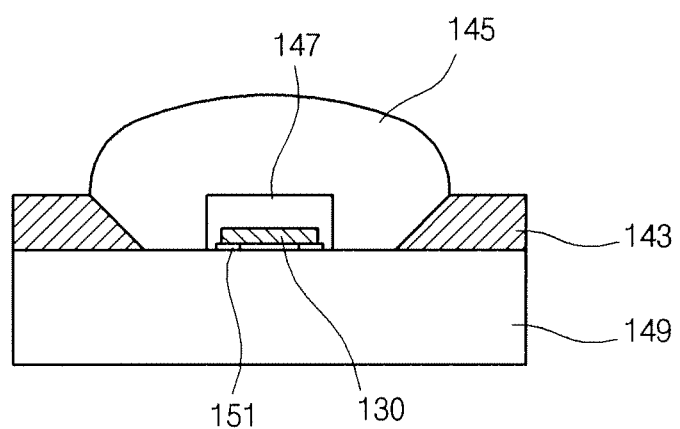
FIG. 3 is a cross-sectional view taken along a line of FIG. 2.

FIG. 2 is a view illustrating an LED element according to a first embodiment of the present invention, and FIG. 3 is a cross-sectional view taken along a line of FIG. 2.

Referring to FIGS. 2 and 3, in the LED 141 element, a reflecting frame 143 is formed on a printed circuit board (PCB) 149 and includes a space. An LED 130 that has polarization property is in the space of the reflecting frame 143 and faces the PCB 149 with a wiring portion 151 therebetween. A fluorescent material surrounds the LED 130.

A lens 145 is configured on the fluorescent material 147 and the LED 130 to uniformly radiate the light from the LED 130.

When a power is applied to the LED 130, light is emitted from the LED 130, incident on the fluorescent material 147 and passes through the lens 145 into the outside.

The reflecting frame 143 emits heat of high temperature accompanied by emission of light from the LED 130 into the outside. The reflecting frame 143 may be made of a material having a high reflectance.

A metal core PCB having property of heat radiation may be used as the PCB 149. The LED element 141 that uses a transparent synthetic resin colored in red, green, blue or the like may be employed.

Figure 4:
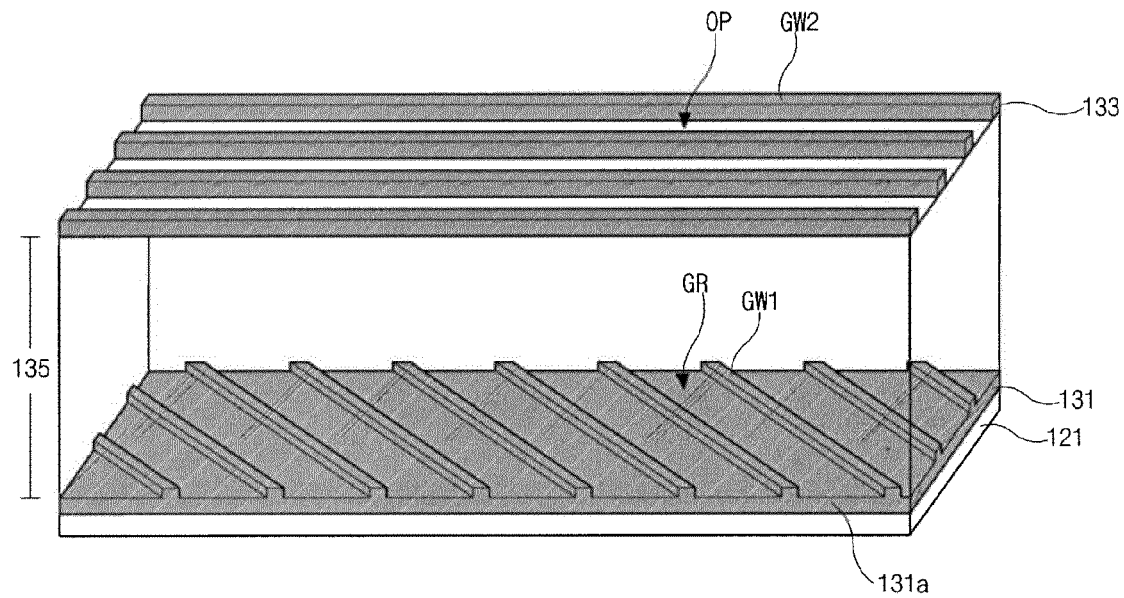
FIG. 4 is a view illustrating a laminate structure of the LED according to the first embodiment of the present invention.
Figure 5:
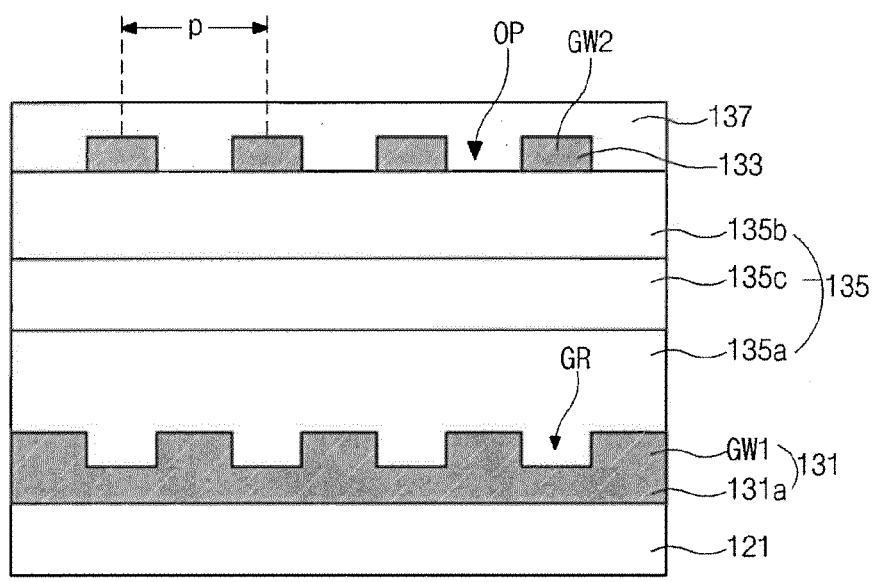
FIG. 5 is a cross-sectional view illustrating the LED according to the first embodiment of the present invention.

The LED 130 having polarization property is explained in more detail with further reference to FIGS. 4 and 5.

FIG. 4 is a view illustrating a laminate structure of the LED according to the first embodiment of the present invention, and FIG. 5 is a cross-sectional view illustrating the LED according to the first embodiment of the present invention.

Referring to FIGS. 4 and 5, the LED 130 includes first and second grid layers 131 and 133 on a substrate 121, and a p-n (positive-negative) semiconductor multiple-layered film 135 between the first and second grid layers 131 and 133. A transparent protection layer 137 may be formed on the second grid layer 133 to protect the LED 130.

The first grid layer 131 may be made of a metal material having high reflectance. For example, the first grid layer 131 may be made of, but not limited to, aluminum (Al), silver (Ag), gold (Au), palladium (Pd) or platinum (Pt), or mixture thereof. The first grid layer 131 may have a thickness of about 2-digit nanometers to about 3-digit nanometers.

The first grid layer 131 includes a base layer 131a and a plurality of first grid wires GW1 that protrudes from the base layer 131a and is along a first direction. A groove GR is between the neighboring first grid wires GW1 and along the first direction.

The first grid layer 131 has an uneven shape in cross section because the first grid wire GW1 and the groove GR are alternately arranged.

The first grid wire GW1 may have a size, for example, a width of a single-digit nanometer. Since the first grid wire GW1 has the nanometer size, it may be referred to as a nano wire.

The second grid layer 133 includes a plurality of second grid wires GW2 along a second direction. The second grid layer 133 may be made of, but not limited to, aluminum (Al), silver (Ag), gold (Au), palladium (Pd) or platinum (Pt), or mixture thereof. The second grid layer 133 may have a thickness of about 2-digit nanometers to about 3-digit nanometers.

An opening OP is between the neighboring second grid wires GW2 and along the second direction. The opening OP exposes a layer below the second grid layer 133.

The plurality of second grid wires GW2 may be connected to one another at at least one ends thereof.

The second grid wire GW2 may have a size, for example, a width of a single-digit nanometer. An arrangement interval between the second grid wires GW2 i.e., a pitch may be 300 nanometers or less. Further, the pitch may be half the wavelength of light emitted from the LED 130 or less.

The first and second grid layers 131 and 133 may function as electrodes that are supplied with driving voltages for the LED 130. For example, the first grid layer 131 functions as a first electrode i.e., an n type electrode, and the second grid layer 133 functions as a second electrode i.e., a p type electrode.

The extension directions i.e., the length directions of the first and second grid wires GW1 and GW2 may be in parallel with or cross each other. It is preferred that the first and second grid wires GW1 and GW2 make an angle of about 45±5 degrees.

Each of the first and second grid wires GW1 and GW2 may have a polygonal shape, such as a triangle, quadrangle or the like, a circular shape, or other geometrical shape.

The p-n semiconductor multiple-layered film 135 may be made of a III-V group semiconductor material, for example, a III-V group nitride semiconductor material.

The p-n semiconductor multiple-layered film 135 may include multiple semiconductor layers, for example, an n type semiconductor layer 135a, a p type semiconductor layer 135b, and an active layer 135c. The n type semiconductor layer 135a may be on a top surface of the first grid layer 131, the p type semiconductor layer 135b may be on a bottom surface of the second grid layer 133, and the active layer 135c may be between the n type and p type semiconductor layers 135a and 135b.

Neighboring layers among the multiple layers of the p-n semiconductor multiple-layered film 135 may be made of the same material or different material. In other words, the p-n semiconductor multiple-layered film 135 may include at least one homojunction structure or at least one heterojunction structure. In the embodiment, configuring the heterojunction is preferred, and this improves electron concentration and hole concentration and emission efficiency is thus improved.

In the p-n semiconductor multiple-layered film 135, an n type gallium nitride (GaN) layer may be used as the n type semiconductor layer 135a, and a p type gallium nitride (GaN) layer may be used as the p type semiconductor layer 135b. The active layer 135c may have a multi-quantum well (MQW) structure. For example, an indium gallium nitride/gallium nitride ((InGaN/GaN) layer may be used as the active layer 135c.

A sapphire substrate, silicon (Si) substrate, gallium arsenic (GaAs) substrate, silicon carbide (SiC) substrate, or gallium nitride (GaN) substrate may be used as the substrate 121. The substrate 121 may be transparent or opaque.

When the first and second grid layers 131 and 133 of the LED 130 as above are supplied with driving voltages, electrons of the n type semiconductor layer 131 and holes of the p type semiconductor layer 133 are combined at the active layer 135 to emit light. The active layer 135 emits a non-polarized light, which is converted into a light linearly polarized in a predetermined direction by the first and second grid layers 131 and 133. Accordingly, the linearly-polarized light is finally emitted from the LED 130. The polarization property of the LED 130 is explained in more detail with further reference to FIG. 6.

Figure 6:
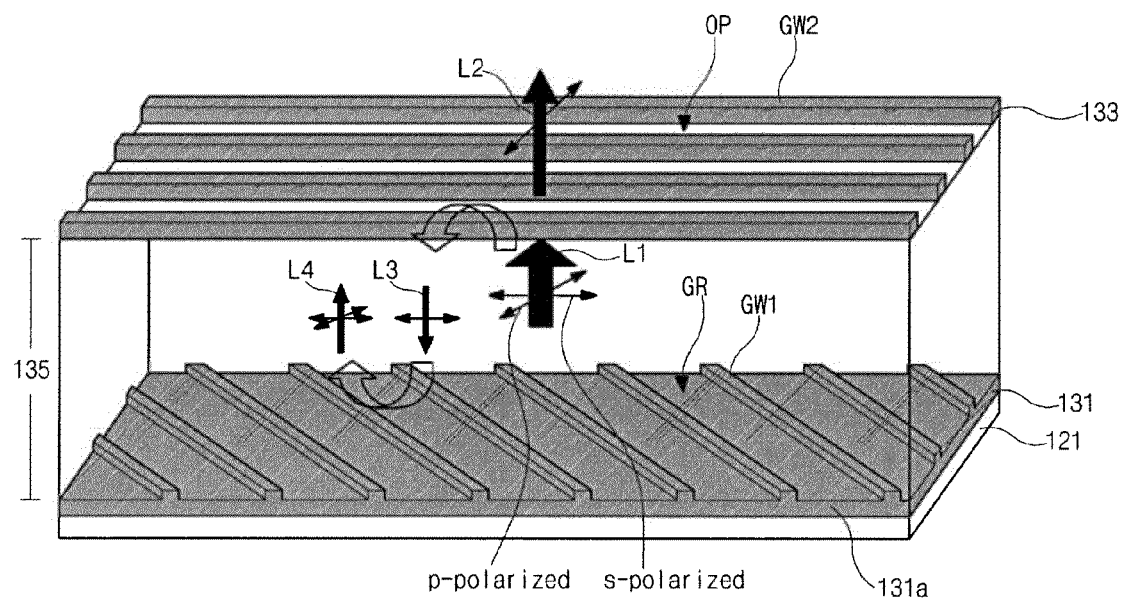
FIG. 6 is a view illustrating the polarization property of the LED according to the first embodiment of the present invention.

FIG. 6 is a view illustrating the polarization property of the LED according to the first embodiment of the present invention.

Referring to FIG. 6, when voltages are applied to the first and second grid layers 131 and 133, the electrons from the n type semiconductor layer 135a and the holes from the p type semiconductor layer 135b are combined at the active layer 135c so that a light L1 is emitted.

The light L1 emitted from the active layer 135c is in non-polarization status. The non-polarized light L1 are categorized into a s-polarized light, which has a polarization direction parallel with the extension direction of the second grid wire GW2, and a p-polarized light which has a polarization direction perpendicular to the extension direction of the second grid wire GW2 (i.e., the width direction of the second grid wire GW2).

As to the p-polarized light, when it is incident on the second grid layer 133, vibration, along the width direction of the nano wire, of free electrons in the second grid layer 133 is spatially limited. In other words, since the width of the second grid wire GW2 is negligibly much smaller than the length thereof, the vibration along the width direction of the free electrons is limited. Accordingly, most of the incident p-polarized light passes through the second grid layer 133, a very few of the p-polarized light not passing through the second grid layer 133 is absorbed or reflected by the second grid layer 133. Thus, most of the p-polarized light L2 passes through the second grid layer 133 and is emitted.

As to the s-polarized light, when it is incident on the second grid layer 133, the free electrons in the second grid layer 133 vibrates along the extension direction i.e., the length direction of the nano wire and thus high reflectance property of metal is shown. Accordingly, most of the incident s-polarized light does not pass through the second grid layer 133 but is reflected by the second grid layer 133, and a very few of the incident s-polarized light is absorbed by the second grid layer 133. As such, the s-polarized light is substantially reflected by the second grid layer 133.

The s-polarized light L3 reflected by the second grid layer 133 is incident on the first grid layer 131. The first grid layer 131 functions as a polarization conversion layer and a reflection layer as well. In other words, since the first grid wire GW1 protruding and extending along the first direction is configured in the first grid layer 131, the first grid layer 131 has an uneven shape and thus functions as a polarization conversion layer. Further, since the first grid layer 131 is made of a metal material having high reflectance, it functions as a reflection layer.

Accordingly, most of the light L3 incident on the first grid layer 131 is reflected and polarization thereof is converted. For example, when a s-polarized light is incident on the first grid layer 131, the s-polarized light is converted into p-polarized and s-polarized lights. Accordingly, the incident s-polarized light is mostly reflected, and the reflected light includes a p-polarized component and an s-polarized component.

The reflected light L4 reflected by the first grid layer 131 is incident again on the second grid layer 133. Referring to the above-described property of the second grid layer 133, among the reflected light L4, the p-polarized component (i.e., the p-polarized light) is emitted while the s-polarized light (i.e., the s-polarized light) is reflected.

Through repetition of the processes as above, the light generated in the LED 130 is emitted as the p-polarized light. As such, in the first embodiment, through the reflections between the first and second grid layers 131 and 133, a light-recycling process is conducted, and thus most of the generated light can be converted into a predetermined polarized light and emitted.

A wavelength range of the light emitted from the LED 130 can be adjusted according to adjustment of the pitch p of the second grid wire GW2. For example, to make a wavelength range of the light from the LED 130 wide or narrow, the pitch p of the second grid wire GW2 is appropriately adjusted. Accordingly, a light having a desired wavelength range can be provided.

A method of fabricating the LED according to the first embodiment of the present invention is explained with reference to FIGS. 7A to 7H.

FIGS. 7A to 7H are cross-sectional views illustrating the LED according to the first embodiment of the present invention.

Figure 7A:
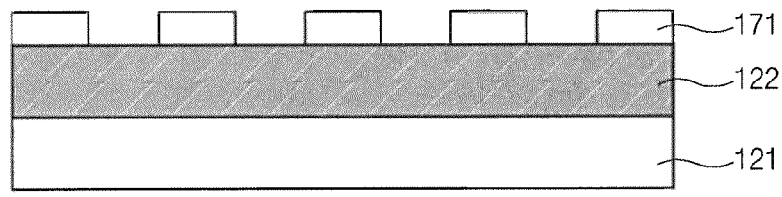
FIGS. 7A to 7H are cross-sectional views illustrating the LED according to the first embodiment of the present invention.

Referring to FIG. 7A, a first metal material is deposited on a substrate 121 to form a first metal layer 122. Then, a first photoresist layer is formed on the first metal layer 122 and a photolithography process is performed using a photo mask. Accordingly, a first photoresist pattern 171 is formed.

Figure 7B:
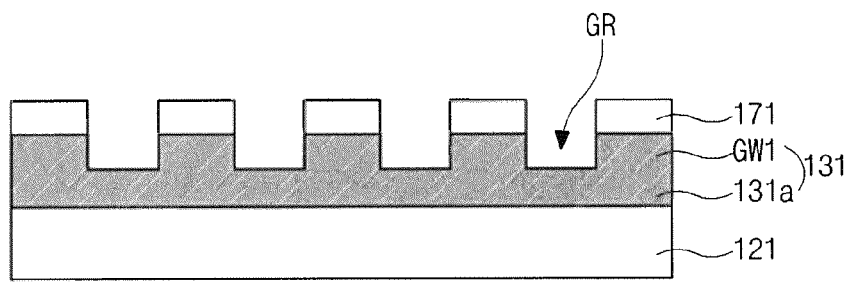

Referring to FIG. 7B, the first metal layer 122 is etched using the first photoresist pattern as an etching mask. The etching process may be performed to partially remove the first metal layer 122. Accordingly, a first grid layer 131 is formed that includes a dent portion where the first metal layer 122 is removed and a protruded portion where the first metal layer 122 is not removed. The dent portion is a groove GR, and the protruded portion is a first grid wire GW1. The groove GR and the first grid wire GW1 extend along a first direction.

Figure 7C:
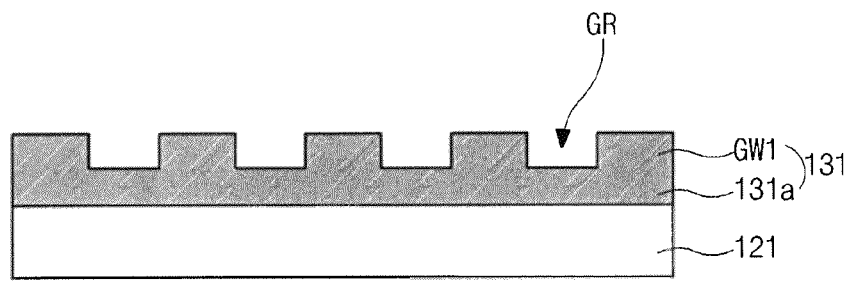

Referring to FIG. 7C, a striping process is performed to remove the first photoresist pattern 171.

Figure 7D:
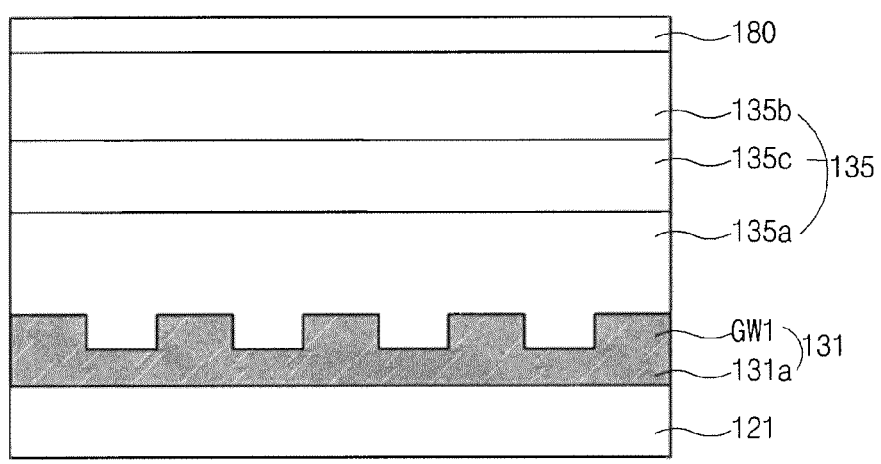

Referring to FIG. 7D, a p-n semiconductor multiple-layered film 135 is formed on the first grid layer 131. For example, through a MOCVD (metal organic chemical vapor deposition) method, a MBE (molecular beam epitaxy) method, a VPE (vapor phase epitaxy) method or the like, an n type semiconductor layer 135a, an active layer 135c and a p type semiconductor layer 135b are sequentially formed.

Then, a second photoresist layer 180 is formed on the p-n semiconductor multiple-layered film 135.

Figure 7E:
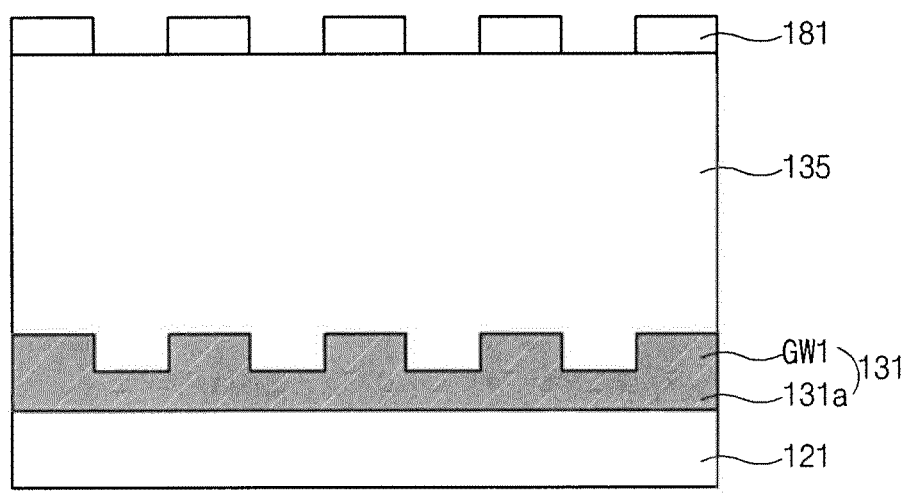

Referring to FIG. 7E, a photolithography process is performed for the second photoresist layer 180 to form a second photoresist pattern 181.

Figure 7F:
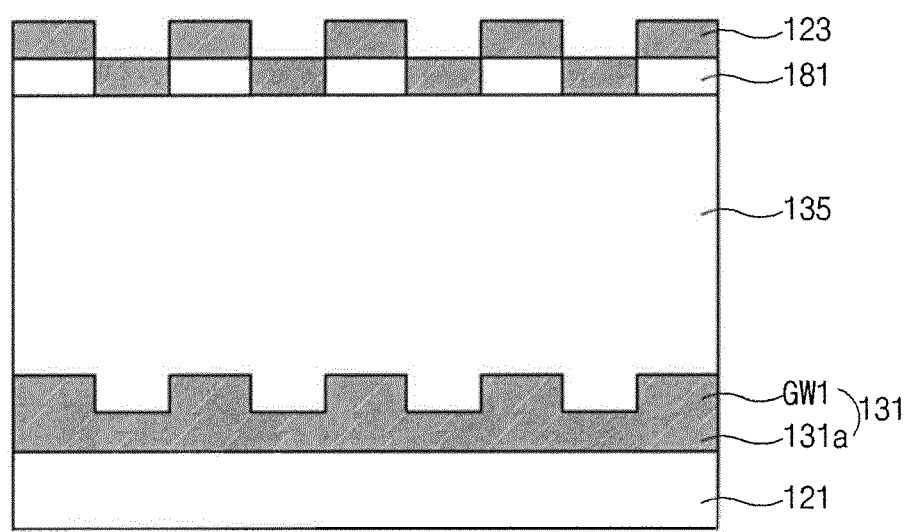

Referring to FIG. 7F, a second metal material is deposited on the substrate 121 having the second photoresist pattern 181 to form a second metal layer 123. The second metal layer 181 is formed on the second photoresist pattern 181 and fills openings of the second photoresist pattern 181.

Figure 7G:
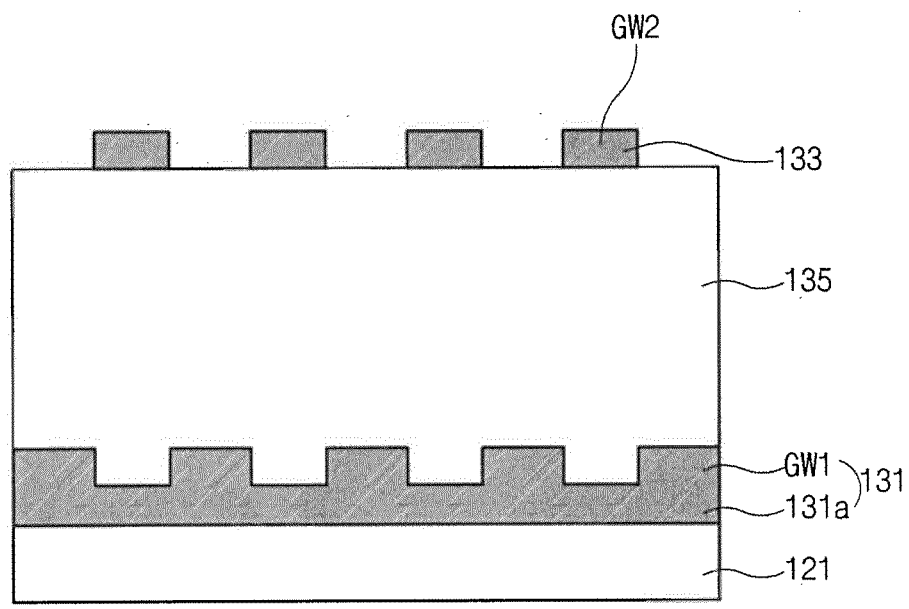

Referring to FIG. 7G, a process to remove the second photoresist pattern 181 is performed. This process may be referred to as a lift-off process. Accordingly, the second metal layer 123 remaining on the second photoresist pattern 181 are removed while the second metal layer 123 in the openings of the second photoresist pattern 181 still remains. Accordingly, a second grid layer 133 including a second grid wire GW2 along a second direction is formed. Since the second photoresist pattern 181 is removed, an opening OP is formed between the neighboring second grid wires GW2.

Figure 7H:
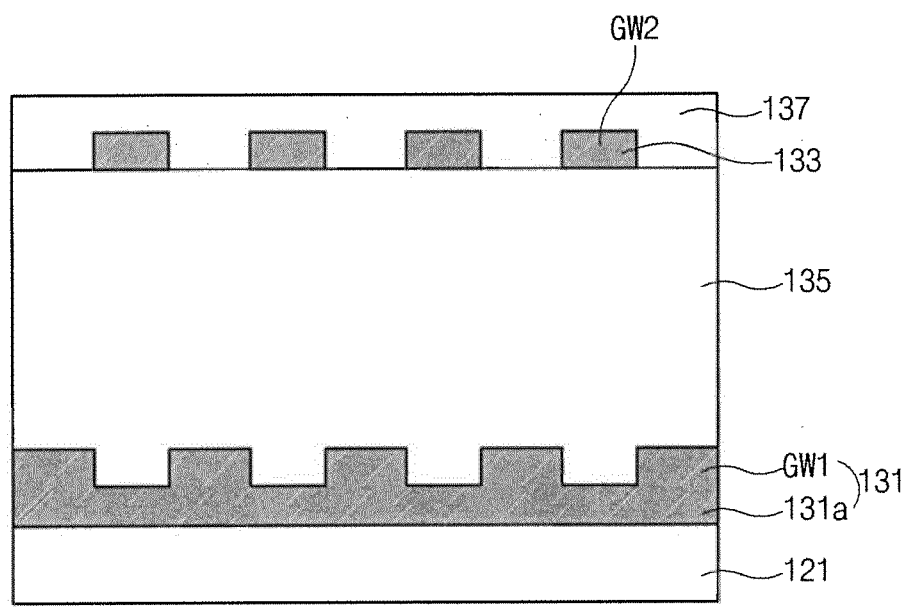

Referring to FIG. 7H, a protection layer 137 is formed on the second grid layer 133. The protection layer 137 may be made of an organic insulating material or an inorganic insulating material.

Through the above-described processes, the LED 130 according to the first embodiment can be fabricated.

In the processes as above, the photolithography process is used to form the first and second grid layers 131 and 133. However, the photolithography process is one example to form the first and second grid layers 131 and 133, and other various methods may be employed. For example, a laser interference patterning method, a nano imprinting method, a self assembly method, a method of selectively inserting and dispersing nanoparticles, a method of thermally depositing nanoparticles, or the like may be used.

Figure 8:
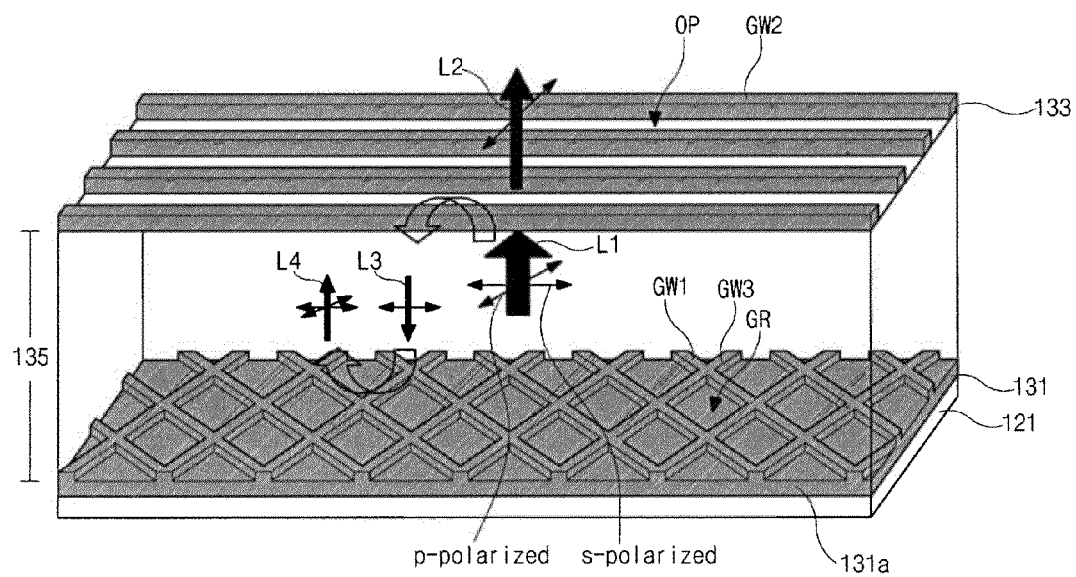
FIG. 8 is a view illustrating a laminate structure of an LED according to a second embodiment of the present invention.

FIG. 8 is a view illustrating a laminate structure of an LED according to a second embodiment of the present invention.

Referring to FIG. 8, the LED 130 of the second embodiment is similar to that of the first embodiment except for configuration of the first grid layer 131. Accordingly, explanations of parts similar to parts of the first embodiment may be omitted.

The LED 130 of the second embodiment includes first and second grid layers 131 and 133 on a substrate 121, and a p-n semiconductor multiple-layered film 135 between the first and second grid layers 131 and 133. Further, a transparent protection layer may be formed on the second grid layer 133 to protect the LED 130 in similar to the first embodiment.

The first grid layer 131 may be made of a metal material having high reflectance.

The first grid layer 131 includes a base layer 131a, a plurality of first grid wires GW1 that protrudes from the base layer 131a and is along a first direction, and a plurality of third grid wires GW3 that protrudes from the base layer 131a and is along a third direction. The first and third grid wires GW1 and GW3 cross each other. The first and third grid wires GW1 and GW3 define a groove GR surrounded thereby.

The first grid layer 131 has an uneven shape in cross section because the first grid wire GW1 and the groove GR are alternately arranged and the third grid wire GW3 and the groove GR are alternately arranged.

Each of the first and third grid wires GW1 and GW3 may have a size, for example, a width of a single-digit nanometer. Since each of the first and third grid wires GW1 and GW3 have the nanometer size, it may be referred to as a nano wire.

The second grid layer 133 includes a plurality of second grid wires GW2 along a second direction.

An opening OP is between the neighboring second grid wires GW2 and along the second direction. The opening OP exposes a layer below the second grid layer 133.

The plurality of second grid wires GW2 may be connected to one another at at least one ends thereof.

The second grid wire GW2 may have a size, for example, a width of a single-digit nanometer. An arrangement interval between the second grid wires GW2 i.e., a pitch may be 300 nanometers or less. Further, the pitch may be half the wavelength of light emitted from the LED 130 or less.

The first and second grid layers 131 and 133 may function as electrodes that are supplied with driving voltages for the LED 130. For example, the first grid layer 131 functions as a first electrode i.e., an n type electrode, and the second grid layer 133 functions as a second electrode i.e., a p type electrode.

The extension directions i.e., the length directions of the first or third grid wire GW1 or GW3, and second grid wire GW2 may be in parallel with or cross each other. It is preferred that the first and second grid wires GW1 and GW2 make an angle of about 45±5 degrees, and the third and second grid wires GW3 and GW2 make an angle of about 45±5 degrees. In this case, the first and third grid wires GW1 and GW3 make an angle of about 90 degrees.

Each of the first to third grid wires GW1 to GW3 may have a polygonal shape, such as a triangle, quadrangle or the like, a circular shape, or other geometrical shape.

The p-n semiconductor multiple-layered film 135 may be made of a III-V group semiconductor material, for example, a III-V group nitride semiconductor material.

The p-n semiconductor multiple-layered film 135 may include multiple semiconductor layers, for example, an n type semiconductor layer (135a of FIG. 5), a p type semiconductor layer (135b of FIG. 5), and an active layer (135c of FIG. 5), as described in the first embodiment.

A polarization property of the LED 130 according to the second embodiment of the present invention is explained in more detail.

When voltages are applied to the first and second grid layers 131 and 133, electrons from the n type semiconductor layer and holes from the p type semiconductor layer are combined at the active layer so that a light L1 is emitted.

The light L1 emitted from the active layer 135c is in non-polarization status. The non-polarized light L1 are categorized into a s-polarized light, which has a polarization direction parallel with the extension direction of the second grid wire GW2, and a p-polarized light which has a polarization direction perpendicular to the extension direction of the second grid wire GW2 (i.e., the width direction of the second grid wire GW2).

As to the p-polarized light, when it is incident on the second grid layer 133, vibration, along the width direction of the nano wire, of free electrons in the second grid layer 133 is spatially limited. In other words, since the width of the second grid wire GW2 is negligibly much smaller than the length thereof, the vibration along the width direction of the free electrons is limited. Accordingly, most of the incident p-polarized light passes through the second grid layer 133, a very few of the p-polarized light not passing through the second grid layer 133 is absorbed or reflected by the second grid layer 133. Thus, most of the p-polarized light L2 passes through the second grid layer 133 and is emitted.

As to the s-polarized light, when it is incident on the second grid layer 133, the free electrons in the second grid layer 133 vibrates along the extension direction i.e., the length direction of the nano wire and thus high reflectance property of metal is shown. Accordingly, most of the incident s-polarized light does not pass through the second grid layer 133 but is reflected by the second grid layer 133, and a very few of the incident s-polarized light is absorbed by the second grid layer 133. As such, the s-polarized light is substantially reflected by the second grid layer 133.

The s-polarized light L3 reflected by the second grid layer 133 is incident on the first grid layer 131. The first grid layer 131 functions as a polarization conversion layer and a reflection layer as well. In other words, since the first grid wire GW1 protruding and extending along the first direction is configured in the first grid layer 131, the first grid layer 131 has an uneven shape and thus functions as a polarization conversion layer. Further, since the third grid wire GW3 crossing the first grid wire GW1 is further configured in the first grid layer 131, the polarization conversion property is improved better than that of the first embodiment.

Further, since the first grid layer 131 is made of a metal material having high reflectance, it functions as a reflection layer.

Accordingly, most of the light L3 incident on the first grid layer 131 is reflected and polarization thereof is converted. For example, when a s-polarized light is incident on the first grid layer 131, the s-polarized light is converted into p-polarized and s-polarized lights. Accordingly, the incident s-polarized light is mostly reflected, and the reflected light includes a p-polarized component and an s-polarized component.

The reflected light L4 reflected by the first grid layer 131 is incident again on the second grid layer 133. Referring to the above-described property of the second grid layer 133, among the reflected light L4, the p-polarized component (i.e., the p-polarized light) is emitted while the s-polarized light (i.e., the s-polarized light) is reflected.

Through repetition of the processes as above, the light generated in the LED 130 is emitted as the p-polarized light. As such, in the second embodiment, through the reflections between the first and second grid layers 131 and 133, a light-recycling process is conducted, and thus most of the generated light can be converted into a predetermined polarized light and emitted.

Figure 9:
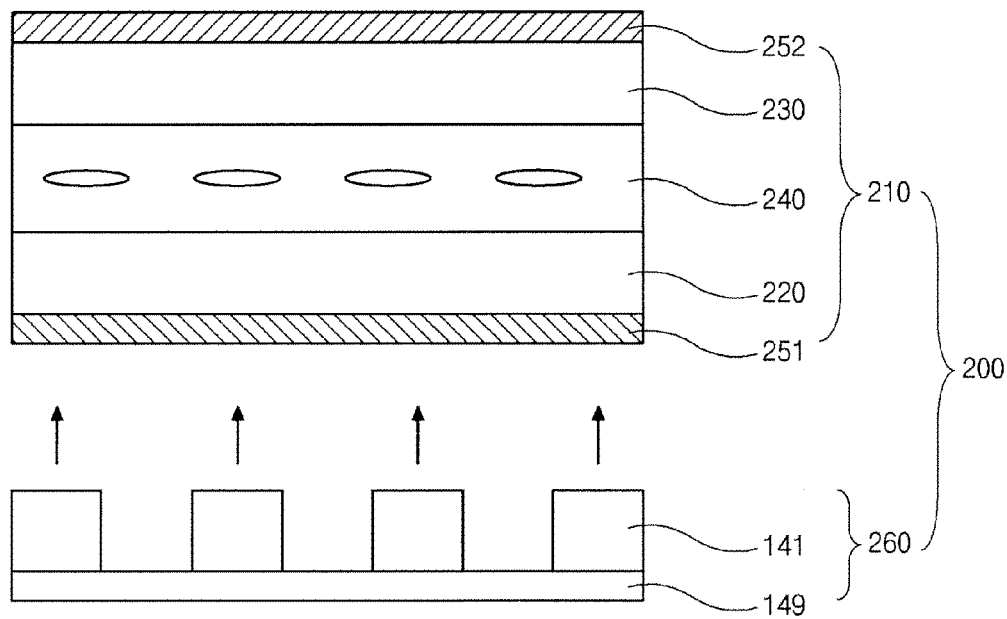
FIG. 9 is a cross-sectional view illustrating an LCD using the LEDs according to the embodiments of the present invention.

An LCD using the LEDs 130 of the embodiments of the present invention as above is explained with further reference to FIG. 9.

FIG. 9 is a cross-sectional view illustrating an LCD using the LEDs according to the embodiments of the present invention.

Referring further to FIG. 9, the LCD 200 includes a liquid crystal panel 210, a backlight unit 260 supplying light to the liquid crystal panel 210, and first and second polarizing plates 251 and 252.

The liquid crystal panel 210 includes first and second substrates 220 and 230, and a liquid crystal layer 240 between the substrates 210 and 220.

The first substrate 220 may be referred to as an array substrate. Although not shown in the drawings, gate and data lines crossing each other to define a pixel region may be formed at the first substrate 210. A switching transistor connected to the gate and data lines and a pixel electrode connected to the switching transistor may be formed in the pixel region of the first substrate 220.

The second substrate 230 may be referred to as a color filter substrate or an opposing substrate. Although not shown in the drawings, a black matrix, a color filter layer and a common electrode may be formed at the second substrate 230. The black matrix may correspond to the gate and data lines and the switching transistor. The color filter layer may correspond to the pixel region. The common electrode may be formed on the color filter layer and face the pixel electrode.

The first and second polarizing plates 251 and 252 may be on outer surfaces of the first and second substrates 220 and 230, respectively. The first and second polarizing plates 251 and 252 have respective polarizing axes. Accordingly, each of the first and second polarizing plates 251 and 252 passes a light polarized in parallel with the axis thereof.

The backlight unit 260 includes a plurality of LED elements 141. The LED element 141 may be mounted on a printing circuit board 149. The LED element 141 includes the LED 130 according to the first or second embodiment.

Although not shown in the drawings, the backlight unit 260 may include at least one optical sheet between the first polarizing plate 251 and the LED element 141. For example, the at least one optical sheet may include a diffusion sheet and a prism sheet.

As described above, the LED 130 converts a non-polarized light generated therein into a predetermined polarized light, for example, a light polarized perpendicularly to the length direction of the second grid wire GW2.

The polarized light from the LED 130 is incident on the first polarizing plate 251. The polarizing axis of the first polarizing plate 251 is substantially identical to the polarizing direction of the polarized light. In other words, the polarizing axis of the first polarizing plate 251 is parallel with the width direction of the second grid wire GW2 i.e., perpendicular to the length direction of the second grid wire GW2.

According to this configuration of the polarizing axis of the first polarizing plate 251, Almost all of the light emitted from the LED element 141 can pass through the first polarizing plate 251. In other words, loss rate of light through the first polarizing plate 251 reaches nearly 0%. Therefore, loss rate of light from the LED 130 can be remarkably reduced compared to the related art. Further, approach to increase power to compensate for loss of light in the related art is not needed, and thus it is efficient in aspect of power consumption.

A method of fabricating the LCD 210 is explained with reference to FIG. 9.

The first and second substrates 220 and 230 are separately fabricated and then coupled with each other with the liquid crystal layer 240 therebetween, and thus the liquid crystal panel 210 is fabricated. The first and second polarizing plates 251 and 252 are attached to the corresponding outer surfaces of the liquid crystal panel 210.

The liquid crystal panel 210 having the polarizing plates 251 and 252 and the backlight unit 260 including the LED elements 141 are assembled using components, for example, a top case, a bottom case, a main supporter and the like. In the assembling, a process of coupling driving circuit components with the liquid crystal panel 210 may be performed.

Through the above processes, the LCD 210 can be fabricated.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode, comprising:
    a first grid layer on a substrate and made of a metal material;
    a p-n semiconductor multiple-layered film on the first grid layer; and
    a second grid layer on the p-n semiconductor multiple-layered film and made of a metal material,
    wherein the first grid layer includes a base layer, and a plurality of first grid wires that protrudes from the base layer and are along a first direction, wherein the base layer and the plurality of first grid wires are monolithic and formed of a metal material having high reflectance,
    wherein the second grid layer includes a plurality of second grid wires along a second direction, and
    wherein the p-n semiconductor multiple-layered film includes an active layer, a n type semiconductor layer between the first grid layer and the active layer, and a p type semiconductor layer between the second grid layer and the active layer.

2. The diode according to claim 1, wherein the first and second directions make an angle of about 45±5 degrees.

3. The diode according to claim 1, wherein a pitch of the second grid wire is about 300 nanometers or less.

4. The diode according to claim 1, wherein the first and second grid layers are supplied with driving voltages.

5. A method of fabricating a light emitting diode, the method comprising:
    forming a first grid layer on a substrate and made of a metal material;
    forming a p-n semiconductor multiple-layered film on the first grid layer; and
    forming a second grid layer on the p-n semiconductor multiple-layered film and made of a metal material,
    wherein the first grid layer includes a base layer, and a plurality of first grid wires that protrudes from the base layer and are along a first direction, wherein the base layer and the plurality of first grid wires are monolithic and formed of a metal material having high reflectance,
    wherein the second grid layer includes a plurality of second grid wires along a second direction, and
    wherein the p-n semiconductor multiple-layered film includes an active layer, a n type semiconductor layer between the first grid layer and the active layer, and a p type semiconductor layer between the second grid layer and the active layer.

6. The method according to claim 5, wherein the first and second directions make an angle of about 45±5 degrees.

7. The method according to claim 5, wherein a pitch of the second grid wire is about 300 nanometers or less.

8. The method according to claim 5, wherein the first and second grid layers are supplied with driving voltages.

9. A liquid crystal display, comprising:
    a liquid crystal panel;
    a backlight unit including a light emitting diode and supplying light to the liquid crystal panel; and
    a polarizing plate between the liquid crystal panel and the backlight unit,
    wherein the light emitting diode includes a first grid layer on a substrate and made of a metal material, a p-n semiconductor multiple-layered film on the first grid layer, and a second grid layer on the p-n semiconductor multiple-layered film and made of a metal material,
    wherein the first grid layer includes a base layer, and a plurality of first grid wires that protrudes from the base layer and are along a first direction, wherein the base layer and the plurality of first grid wires are monolithic and formed of a metal material having high reflectance,
    wherein the second grid layer includes a plurality of second grid wires along a second direction,
    wherein the p-n semiconductor multiple-layered film includes an active layer, a n type semiconductor layer between the first grid layer and the active layer, and a p type semiconductor layer between the second grid layer and the active layer, and
    wherein a polarizing axis of the polarizing plate is perpendicular to the second direction.

10. The display according to claim 9, wherein the first and second directions make an angle of about 45±5 degrees.

11. The display according to claim 9, wherein a pitch of the second grid wire is about 300 nanometers or less.

12. The display according to claim 9, wherein the first and second grid layers are supplied with driving voltages.

13. A light emitting diode, comprising:
    a first grid layer on a substrate and made of a metal material;
    a p-n semiconductor multiple-layered film on the first grid layer; and
    a second grid layer on the p-n semiconductor multiple-layered film and made of a metal material, wherein the first grid layer includes a base layer, a plurality of first grid wires that protrudes from the base layer and are along a first direction, and a plurality of third grid wires that protrudes from the base layer and are along a third direction, wherein the base layer, the plurality of first grid wires and the plurality of third grid wires are monolithic and formed of a metal material having high reflectance, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

14. The diode according to claim 13, wherein the first and third directions cross each other, and each of the first and third directions and the second direction make an angle of about 45±5 degrees.

15. The diode according to claim 13, wherein a pitch of the second grid wire is about 300 nanometers or less.

16. The diode according to claim 13, wherein the first and second grid layers are supplied with driving voltages.

17. A method of fabricating a light emitting diode, the method comprising:

forming a first grid layer on a substrate and made of a metal material;

forming a p-n semiconductor multiple-layered film on the first grid layer; and forming a second grid layer on the p-n semiconductor multiple-layered film and made of a metal material, wherein the first grid layer includes a base layer, a plurality of first grid wires that protrudes from the base layer and are along a first direction, and a plurality of third grid wires that protrudes from the base layer and are along a third direction, wherein the base layer, the plurality of first grid wires and the plurality of third grid wires are monolithic and formed of a metal material having high reflectance, wherein the second grid layer includes a plurality of second grid wires along a second direction, and wherein the p-n semiconductor multiple-layered film includes an active layer, a n type semiconductor layer between the first grid layer and the active layer, and a p type semiconductor layer between the second grid layer and the active layer.

18. The method according to claim 17, wherein the first and third directions cross each other, and each of the first and third directions and the second direction make an angle of about 45±5 degrees.

19. The method according to claim 17, wherein a pitch of the second grid wire is about 300 nanometers or less.

20. The method according to claim 17, wherein the first and second grid layers are supplied with driving voltages.

21. A liquid crystal display, comprising:

a liquid crystal panel;

a backlight unit including a light emitting diode and supplying light to the liquid crystal panel; and a polarizing plate between the liquid crystal panel and the backlight unit, wherein the light emitting diode includes a first grid layer on a substrate and made of a metal material, a p-n semiconductor multiple-layered film on the first grid layer, and a second grid layer on the p-n semiconductor multiple-layered film and made of a metal material, wherein the first grid layer includes a base layer, a plurality of first grid wires that protrudes from the base layer and are along a first direction, and a plurality of third grid wires that protrudes from the base layer and are along a third direction, wherein the base layer, the plurality of first grid wires and the plurality of third grid wires are monolithic and formed of a metal material having high reflectance, wherein the second grid layer includes a plurality of second grid wires along a second direction, wherein the p-n semiconductor multiple-layered film includes an active layer, a n type semiconductor layer between the first grid layer and the active layer, and a p type semiconductor layer between the second grid layer and the active layer, and wherein a polarizing axis of the polarizing plate is perpendicular to the second direction.

22. The display according to claim 21, wherein the first and third directions cross each other, and each of the first and third directions and the second direction make an angle of about 45±5 degrees.

23. The display according to claim 21, wherein a pitch of the second grid wire is about 300 nanometers or less.

24. The display according to claim 21, wherein the first and second grid layers are supplied with driving voltages.

* * * * *